United States Patent
Beaman et al.

(10) Patent No.: US 9,484,649 B2
(45) Date of Patent: Nov. 1, 2016

(54) ELECTROMECHANICAL ASSEMBLY WITH SOCKET AND CARD EDGE CONNECTOR

(71) Applicant: Lenovo Enterprise Solutions (Singapore) Pte. Ltd., Singapore (SG)

(72) Inventors: Brian Samuel Beaman, Apex, NC (US); Wen Hsin Chen, New Taipei (TW)

(73) Assignee: Lenovo Enterprise Solutions (Singapore) PTE. LTD., New Tech Park (SG)

( * ) Notice: Subject to any disclaimer, the term of this patent is extended or adjusted under 35 U.S.C. 154(b) by 0 days.

(21) Appl. No.: 14/610,724

(22) Filed: Jan. 30, 2015

(65) Prior Publication Data
US 2016/0226166 A1    Aug. 4, 2016

(51) Int. Cl.
*H01R 24/00* (2011.01)
*H01R 12/73* (2011.01)
*H01R 13/629* (2006.01)

(52) U.S. Cl.
CPC ............ *H01R 12/73* (2013.01); *H01R 13/629* (2013.01)

(58) Field of Classification Search
CPC .............................. H01R 12/73; H01R 12/732
USPC ................................. 439/70, 637, 71, 65, 631
See application file for complete search history.

(56) References Cited

U.S. PATENT DOCUMENTS

| | | | |
|---|---|---|---|
| 5,493,237 A * | 2/1996 | Volz .................... | G01R 1/0483 324/756.05 |
| 6,347,946 B1 | 2/2002 | Trobough et al. | |
| 6,461,169 B1 | 10/2002 | Harrison et al. | |
| 6,551,844 B1 | 4/2003 | Eldridge et al. | |
| 6,731,515 B2 * | 5/2004 | Rhoads ................ | H05K 7/1444 361/785 |
| 6,815,251 B1 | 11/2004 | Akram et al. | |
| 6,884,086 B1 | 4/2005 | Ruttan et al. | |
| 7,014,472 B2 * | 3/2006 | Fjelstad ................ | H05K 1/147 439/637 |
| 7,212,408 B2 | 5/2007 | Noble | |
| 7,361,844 B2 | 4/2008 | Vinciarelli et al. | |
| 8,466,543 B2 | 6/2013 | Fleischman et al. | |
| 8,632,366 B2 * | 1/2014 | Sano ................... | H01R 12/716 439/157 |
| 2013/0266274 A1 | 10/2013 | Little et al. | |

* cited by examiner

*Primary Examiner* — Phuong Dinh
(74) *Attorney, Agent, or Firm* — Katherine Brown

(57) ABSTRACT

An electromechanical assembly includes a socket housing having a cavity for seating an integrated circuit and a first plurality of electrical contacts in the cavity to electrically connect an integrated circuit seated in the socket housing with a circuit board upon which the electromechanical assembly is mounted. The socket housing has a supporting body on a different plane than a bottom surface of the cavity. The socket housing has a second plurality of electrical contacts that form a first row across the supporting body and a third plurality of electrical contacts that form a second row across the supporting body. The socket housing has alignment elements. The electromechanical assembly also includes a card edge connector having slots that accept the alignment elements of the socket housing, a fourth plurality of electrical contacts that form a third row, and a fifth plurality of electrical contacts that form a fourth row.

19 Claims, 15 Drawing Sheets

ELECTROMECHANICAL ASSEMBLY WITH SOCKET AND CARD EDGE CONNECTOR

BACKGROUND

Embodiments of the inventive subject matter generally relate to the field of circuit packaging, and, more particularly, to a land grid array socket with an integrated card edge connector.

A circuit card, such as a packaged integrated circuit, may connect to a printed circuit board ("PCB") using a land grid array ("LGA") socket. Socket contacts may pass through a socket to electrically connect conductive pads on a circuit card to electrical connectors on a printed circuit board. The circuit card can then communicate through a number of electrical paths or traces within the PCB. However, as signals are sent at higher and higher frequencies, the distance that a trace within a PCB can carry a signal becomes increasingly limited due to signal latency and attenuation.

SUMMARY

Embodiments of the disclosure generally include an electromechanical assembly comprising a socket housing and a card edge connector. The socket housing has a cavity for seating an integrated circuit and a first plurality of electrical contacts in the cavity to electrically connect an integrated circuit seated in the socket housing with a circuit board upon which the electromechanical assembly is mounted. The socket housing also has a supporting body on a different plane than a bottom surface of the cavity. The socket housing also has a second plurality of electrical contacts that form a first row across the supporting body and a third plurality of electrical contacts that form a second row across the supporting body. The socket housing also has alignment elements. The card edge connector has slots that accept the alignment elements of the socket housing. The card edge connector also has a fourth plurality of electrical contacts that form a third row and a fifth plurality of electrical contacts that form a fourth row.

BRIEF DESCRIPTION OF THE DRAWINGS

The present embodiments may be better understood to those skilled in the art by referencing the accompanying drawings.

DESCRIPTION OF EMBODIMENT(S)

The description that follows includes examples that embody the present inventive subject matter. However, it is understood that the described embodiments may be practiced without these specific details. For instance, although examples refer to using an LGA socket, other sockets such as a pin grid array socket or zero force insertion socket may be used. In other instances, well-known structures have not been shown in detail in order not to obfuscate the description.

Most conventional circuit packaging designs use input/output ("I/O") signal connections to communicate between multiple circuit cards, such as interface cards for I/O cables and packaged integrated circuits like processors. I/O signal connections are often routed through traces in a printed circuit board ("PCB") or, when a longer connection is required, are routed through a passive copper cable or an active optics cable. A circuit card may connect to a PCB using a land grid array ("LGA") socket. The circuit card in the LGA socket may then be connected through traces in the PCB to another circuit card. As processor performance and I/O signal frequencies increase, the allowable trace length is shortened because higher frequency signals are more susceptible to losses in signal strength due to attenuation in the dielectric materials of PCBs. Because trace lengths are limited, a more direct connection between two circuit cards is useful. Integrating a card edge connector with an LGA socket allows for a more direct connection between two circuit cards.

Figure 1:
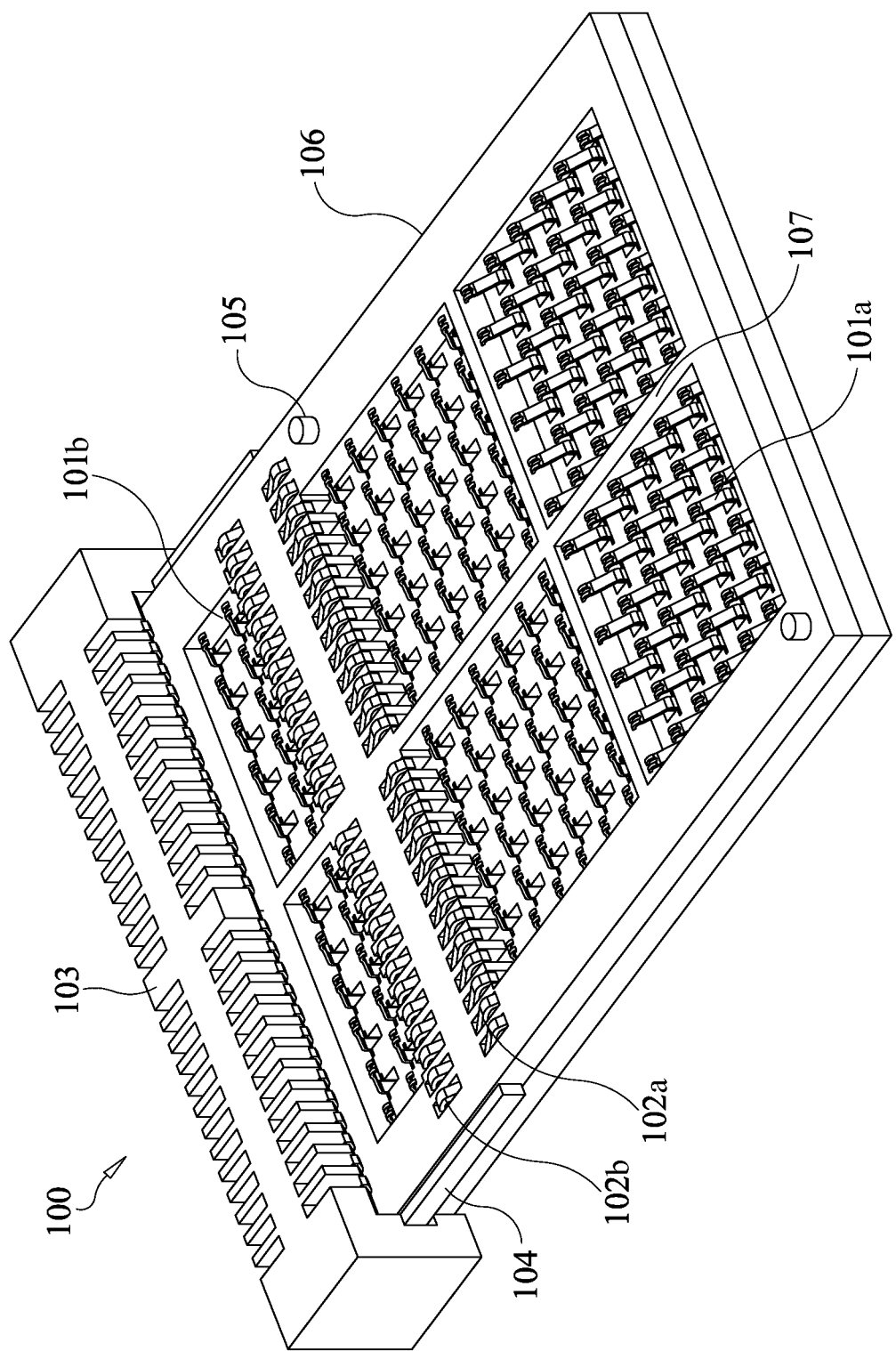
FIG. 1 depicts an LGA socket with a card edge connector.

FIG. 1 depicts an LGA socket with a card edge connector. FIG. 1 depicts an LGA socket 100 that includes socket contacts 101a and 101b, card edge contacts 102a and 102b, a rib element 104, an alignment pin 105, a socket housing 106, and a supporting body 107. Also, FIG. 1 depicts a card edge connector 103.

The LGA socket 100 includes a first footprint of socket contacts 101a and second footprint of socket contacts 101b. The socket contacts 101a and 101b are positioned to make contact with electrical connection points or conductive pads on circuit cards. The positioning and the number of socket contacts 101a and 101b may vary as necessary to suit different configurations of connection points on a circuit card. The footprint of socket contacts 101a within the socket housing 106 create a cavity in which an integrated circuit can be seated. The socket contacts 101b are positioned to make contact with the connection points on the bottom of a circuit card, once the circuit card has mated with the card edge connector 103. The socket contacts 101a and 101b may extend from the top side to the bottom side of the LGA socket housing 106. Once the LGA socket 100 is mounted on a PCB, the socket contacts 101 may connect with traces in the PCB to allow for communication between a seated circuit card and other components on the PCB. The socket contacts 101a and 101b are located on either side of the card edge contacts 102a and 102b. As depicted FIG. 1, the footprint of socket contacts 101a is larger and has greater number of socket contacts, and the footprint of socket contacts 101b is smaller and has a lesser number of socket contacts. Other embodiments may have equally sized footprints of socket contacts 101a and 101b. Also, some embodiments may only have the footprint of socket contacts 101a.

The card edge contacts 102a and 102b are integrated into the LGA socket 100. The two rows of card edge contacts 102a and 102b are exposed from the socket housing 106 and are positioned to make contact with card edge contacts on the bottom of two circuit cards. The positioning and the number of card edge contacts 102a and 102b may vary as necessary to suit different configurations of card edge contacts on circuit cards. The card edge contacts 102a connect to a first circuit card, and the card edge contacts 102b connect to a second circuit card. Each contact in the card edge contacts 102a is electrically connected with a corresponding contact in the card edge contacts 102b. So, when a circuit card is connected to the card edge contacts 102a and a second circuit card is connected to the card edge contacts 102b, the two circuit cards are electrically connected and may communicate through the circuit card contacts 102a and 102b.

In FIG. 1, the card edge connector 103 is a movable component of the LGA socket 100. The card edge connector 103 is adapted to accept a first circuit card and be moved to a position that electronically mates/connects the first circuit card to a second circuit card that is seated in the LGA socket 100 via the card edge contacts 102a and 102b. The card edge connector 103 provides card edge contacts that connect to card edge contacts on the top surfaces of two circuit cards and secures the physical connection of the circuit cards. The card edge connector 103 has portions on each end that extend to the sides of the socket housing 106. Each portion is slotted on the edge facing the socket housing 106. The socket housing 106 includes the rib element 104. There is another rib element (not fully depicted) similar to rib element 104 located on the opposite edge of the socket housing 106. The slots of the card edge connector 103 are sized to slide along the rib elements and allow the contacts of a circuit card inserted into the card edge connector 103 to come into contact with the card edge contacts 102b. The rib elements aid in aligning the card edge connector 103 when installing a circuit card, as explained in further detail below. The card edge connector 103 also includes two rows of card edge contacts located within the card edge connector 103 housing. One row is positioned so that each contact in the card edge connector 103 corresponds to a contact of the card edge contacts 102a, and a second row is positioned so that each contact in the card edge connector 103 corresponds to a contact of the card edge contacts 102b. Once the card edge connector 103 has been moved into the card mating or connection position, the contacts of the card edge connector 103 allow a first circuit card inserted into the card edge connector 103 and a second circuit card seated in the LGA socket 100 to communicate through the card edge contacts of the circuit cards. Additionally, the card edge connector 103 helps physically secure the connection of the circuit cards to the LGA socket 100.

The rib element 104 and the rib element located on the opposite side of the socket housing 106 may be identical in size. However, in some embodiments, the rib element 104 may have a greater or lesser height than the opposite rib element with the corresponding slots in the card edge connector 103 sized to accommodate the different heights. Having differently sized slots and rib elements allows the card edge connector 103 to only be installed in a single direction, which may be useful in some applications. Alignment elements other than the rib element and slots may be used. For example, the card edge connector housing may have a square receptacle in each extended portion that fastens over a corresponding protrusion from the socket housing 106.

The socket housing 106 may include various features to aid in the installation and seating of circuit cards. As depicted in FIG. 1, the socket housing 106 includes the alignment pin 105 and the supporting body 107. The alignment pin 105 interfaces with corresponding holes on a circuit card to align electrical connectors on the bottom of the circuit card with the socket contacts 101a and card edge contacts 102a. The supporting body 107 is located within the cavities of the housing 106 that are created by the socket contacts 101a and socket contacts 101b and extends from the housing in a vertical direction. The supporting body 107 is sized so that structural support is given to the bottom of seated circuit cards, while still allowing the socket contacts 101a and 101b to make contact with the circuit cards. The structural support given by the supporting body 107 helps prevent a circuit card from bending during seating thereby disrupting a connection with the card edge contacts 102a or 102b.

The card edge connector 103, as depicted in FIG. 1, can be a separate piece from the LGA socket 100, but integrates with the LGA socket 100 by sliding into place over the rib element 104. In some embodiments, the card edge connector 103 may be permanently affixed to the LGA socket 100 but may still utilize the same rib element 104 in card installation. In other embodiments, the card edge connector 103 may be attached to the socket housing 106 by a hinge located on an edge of the card edge connector 103. The opposite edge of the card edge connector 103 may contain a latch to secure the card edge connector 103 in a closed position by mating with a corresponding latch on the socket housing 106. The card edge connector 103 should be positioned in line with the card edge contacts 102 so that when the card edge connector 103 is in the closed position the card edge contacts located in the card edge connector 103 align with the card edge contacts 102.

All elements described above that make electrical connections, such as the socket contacts 101a and 101b and the card edge contacts 102a and 101b, may be made of any electrically conductive material, such as copper. Other elements, such as the socket housing 106 and the alignment pin 105, may be made of any non-conductive material, such as plastic.

FIGS. 2-5 depict the installation of a processor module and a circuit card into the LGA socket 100 using the card edge connector 103. The installation depicted in FIGS. 2-5 is just one example of a way in which a processor module and circuit card could be installed. Additionally, the processor module and the circuit card are used for illustrative purposes only and should not be used to limit the scope of the claims, as the LGA socket 100 may be configured to accept the installation of a variety of circuit cards. For example, the LGA socket 100 may be configured to accept two processor modules.

Figure 2:
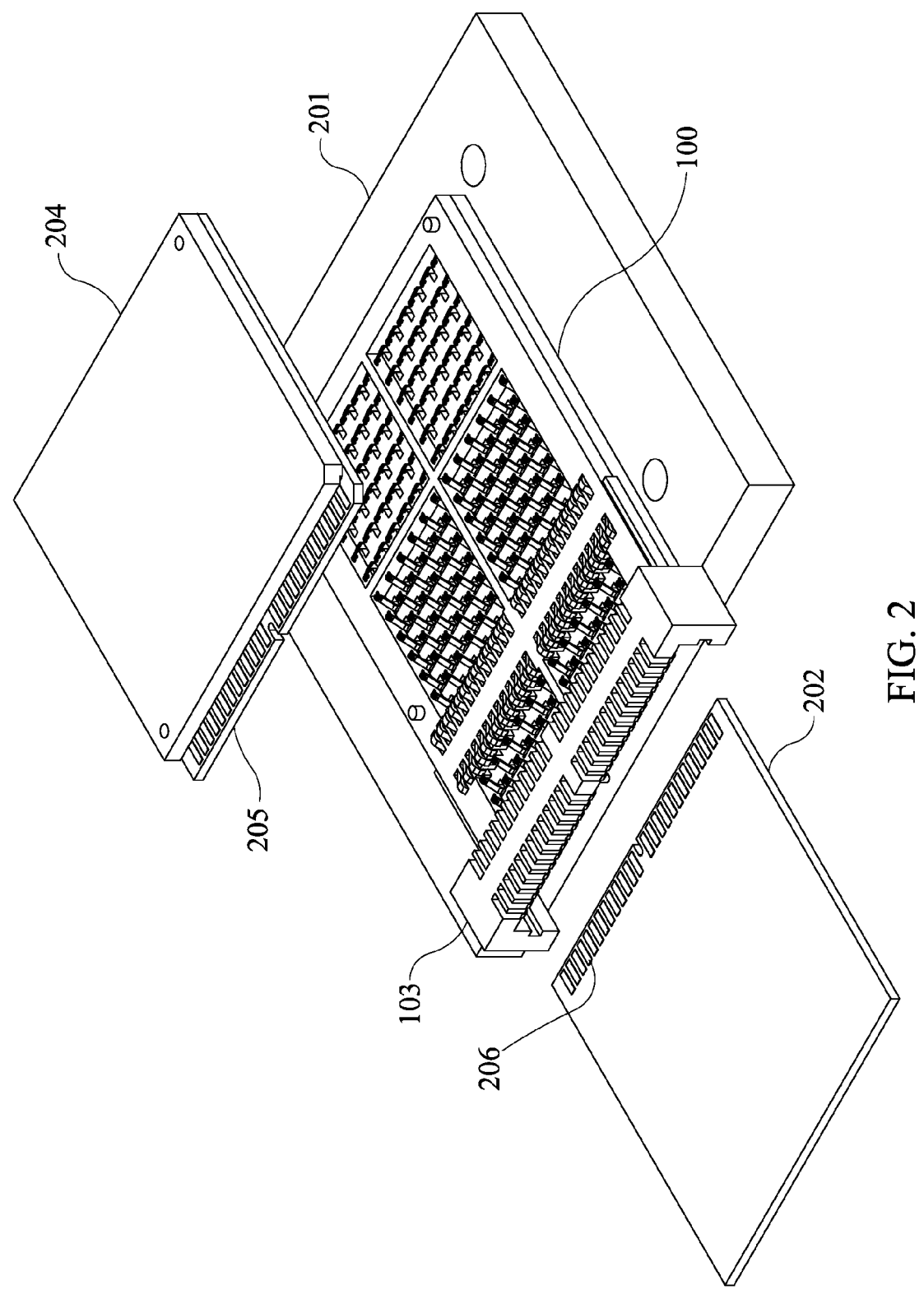
FIG. 2 depicts a processor module and a circuit card before installation into an LGA socket using a card edge connector.

FIG. 2 depicts a processor module and a circuit card before installation into an LGA socket using a card edge connector. FIG. 2 depicts the LGA socket 100, the card edge connector 103, a processor module 204, and a circuit card 202. The LGA socket 100 and the card edge connector 103 are the same as described above in FIG. 1; however, the LGA socket 100 is now mounted on PCB 201. The connection between the LGA socket 100 and the PCB is discussed in further detail below. The processor module 204 includes an extended edge 205 that includes card edge contacts. The circuit card 202 includes card edge contacts 206 and may also have conductive pads on the bottom (not depicted) that interface with the socket contacts of the LGA socket 100. The processor module 204 is positioned to be installed in a Z-axis direction, and the circuit card 202 is positioned to be installed in an X-axis direction.

Figure 3:
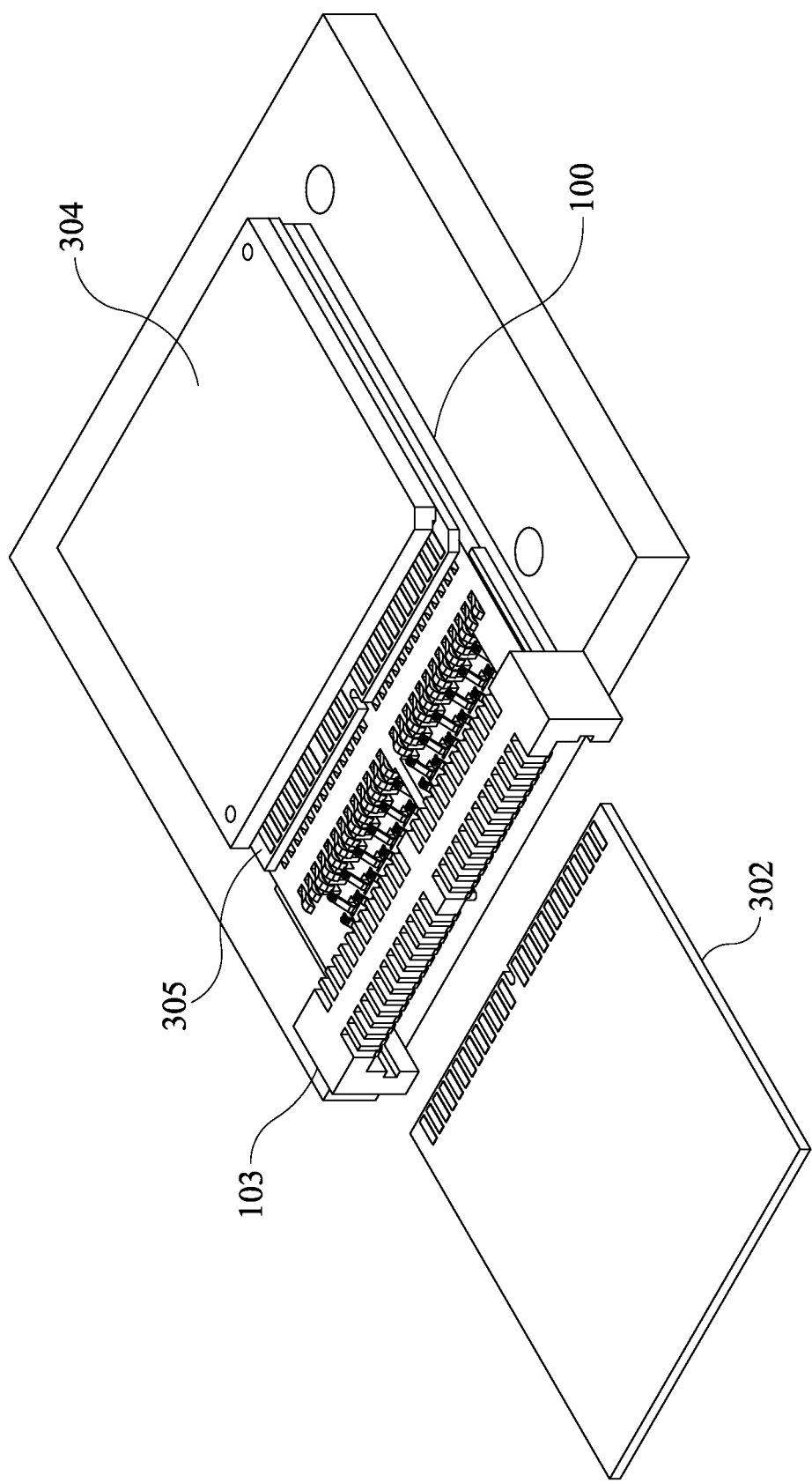
FIG. 3 depicts a processor module seated in an LGA socket and a circuit card before installation into an LGA socket using a card edge connector.

FIG. 3 depicts a processor module seated in an LGA socket and a circuit card before installation into an LGA socket using a card edge connector. FIG. 3 depicts a processor module 304 that is seated into the LGA socket 100. The processor module 304 may be seated into a cavity of the LGA socket 100 using Z-axis or vertical loading and may be aligned by alignment pins located on the LGA socket 100. Since the processor module 304 is seated, the card edge contacts located on the bottom of the extended edge 305 are in contact with a row of the card edge contacts located on the LGA socket 100. Additionally, electrical connectors, if any, on the bottom of processor module 304 are in contact with the socket contacts of the LGA socket 100. FIG. 3 also depicts the card edge connector 103 and a circuit card 302, which are uninstalled.

Figure 4:
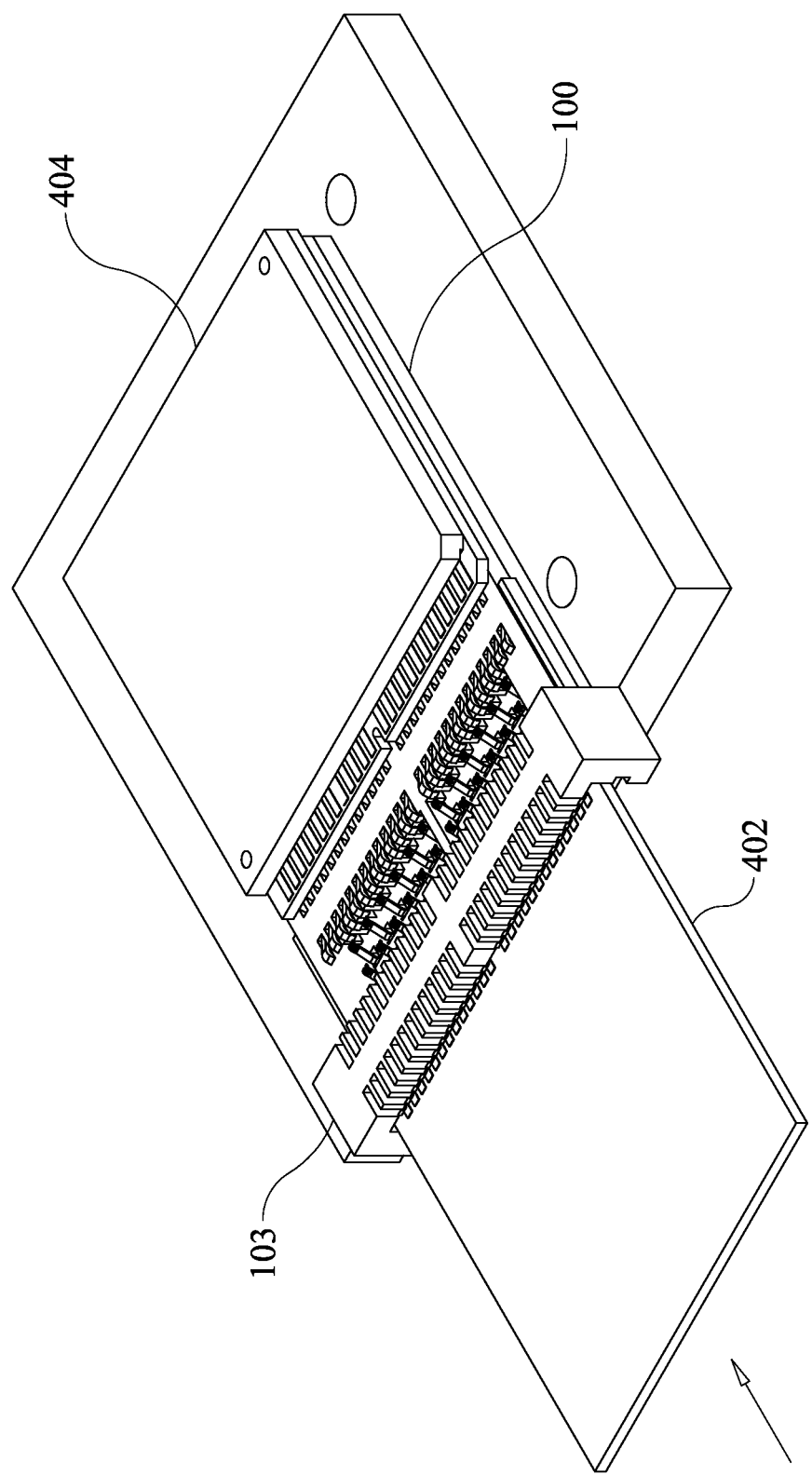
FIG. 4 depicts a processor module seated in an LGA socket and a circuit card in contact with a card edge connector before installation.

FIG. 4 depicts a processor module seated in an LGA socket and a circuit card in contact with a card edge connector before installation. FIG. 4 depicts processor module 404 with an extended edge that is seated into the LGA socket 100. Also depicted is a circuit card 402 that includes card edge contacts. The card edge contacts on the top of the circuit card 402 are in contact with the card edge contacts of the card edge connector 103 and the circuit card 402 is in position for installation. As depicted in FIG. 4, the electrical connectors, if any, and the card edge contacts on the bottom of the circuit card 402 are not yet in contact with any contacts on the LGA socket 100.

Figure 5:
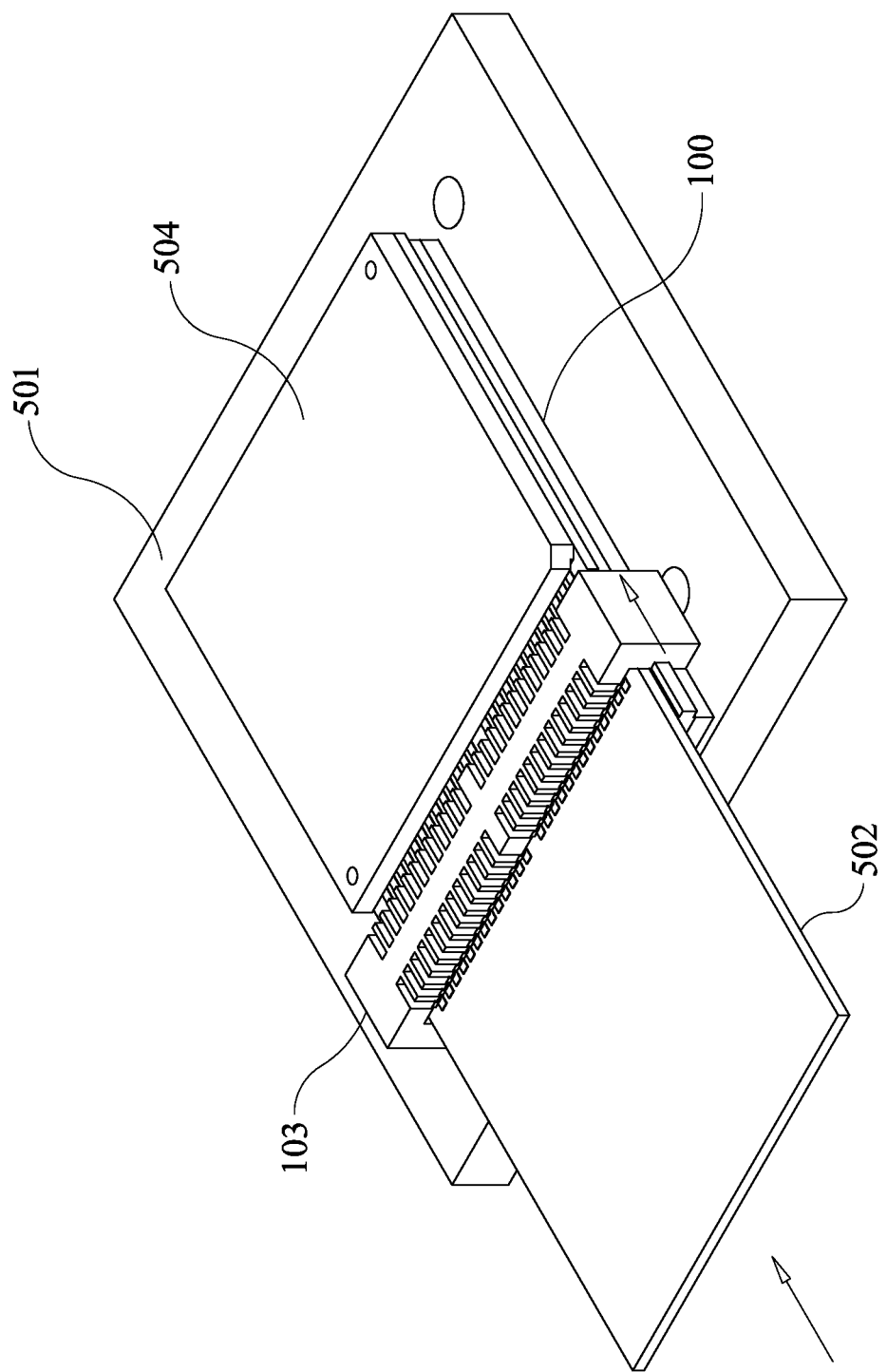
FIG. 5 depicts a processor module and a circuit card installed on an LGA socket with an integrated card edge connector.

FIG. 5 depicts a processor module and a circuit card installed on an LGA socket with an integrated card edge connector. FIG. 5 depicts a processor module 504 that is seated into the LGA socket 100 installed on a PCB 501. Additionally, FIG. 5 depicts the card edge connector 103 that is integrated with the LGA socket 100 and fully mated with a circuit card 502 and an extended edge of the processor module 504. As depicted in FIG. 5, the card edge connector 103 and the circuit card 502 have been moved into a connection or mating position on the LGA socket 100. The card edge connector 103 has slid over the rib elements of the LGA socket 100 in the direction of the depicted arrow and moved into contact with the card edge contacts on top of the extended edge of the processor module 504. Similarly, the circuit card 502 moved in the direction of the arrow so that the card edge contacts on the bottom of the circuit card 502 are in contact with the card edge contacts on the LGA socket 100. Additionally, any conductive pads on the bottom of the circuit card 502 are in contact with socket contacts on the LGA socket 100. Now installed, the processor module 504 and circuit card 502 are electrically connected and may communicate with each other through the card edge contacts of the LGA socket 100 and the card edge connector 103. Additionally, the processor module 504 and circuit card 502 may communicate with other modules installed on the PCB 501 (not depicted) through the socket contacts of the LGA socket 100 and traces installed in the PCB 501.

Figure 6:
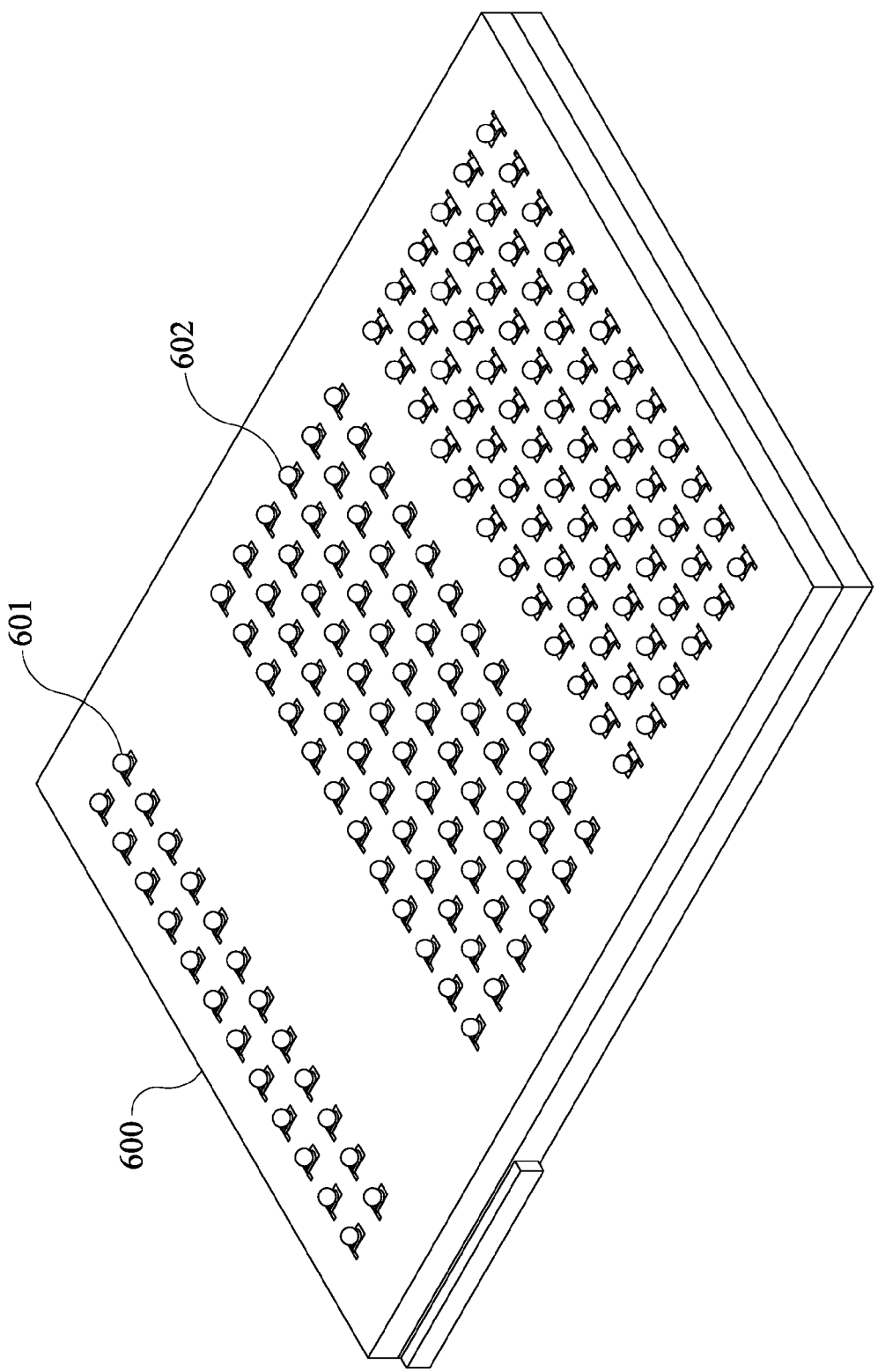
FIG. 6 depicts an underside of an LGA socket with a ball grid array for surface-mounting.

FIG. 6 depicts an underside of an LGA socket with a ball grid array for surface-mounting. FIG. 6 depicts an LGA socket housing 600, a small ball grid array ("BGA") 601, and a large BGA 602, which make up the underside of an LGA socket, such as the LGA socket 100 depicted in FIG. 1. Each contact of the small BGA 601 and large BGA 602 corresponds to an LGA socket contact (not depicted) located on the reverse side of the LGA socket housing 600. The small BGA 601 corresponds to a smaller footprint of LGA socket contacts for a first circuit card and the large BGA 602 corresponds to a larger footprint of LGA socket contacts for a second circuit card. The small BGA 601 and large BGA 602 allow the LGA socket housing 600 to be surface-mounted to a PCB. The BGA connections to a PCB allow a circuit card mounted in the LGA socket to communicate to other components mounted on the PCB through traces in the PCB.

Although FIG. 6 depicts an LGA socket with a BGA for surface mounting, other means for surface mounting may be used. For example, a pin grid array may be used.

Figure 7:
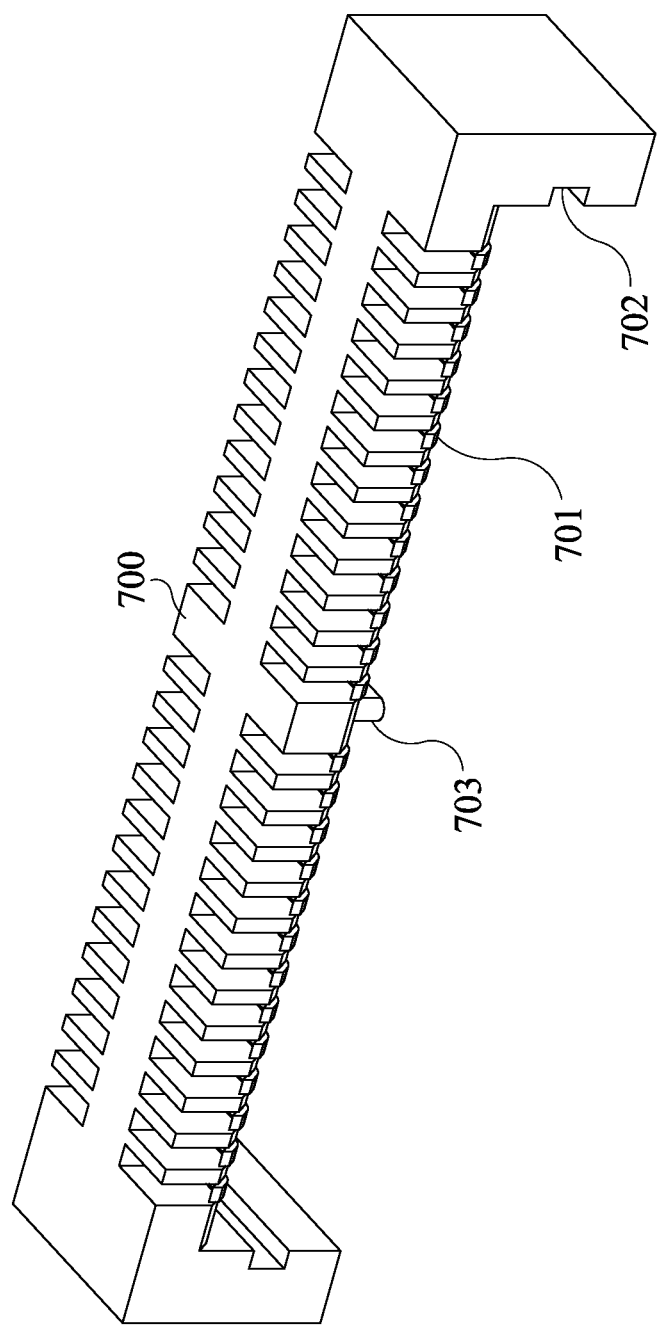
FIG. 7 depicts a top view of a card edge connector.

FIG. 7 depicts a top view of a card edge connector. FIG. 7 depicts a card edge connector that includes a housing 700, card edge contacts 701, slots 702, and alignment element 703. The housing 700 is made of a non-conductive material, such as plastic, and houses the card edge contacts 701. Included as part of the housing are the slots 702 and the alignment element 703. The slots 702 guide the card edge connector into place when sliding onto an LGA socket. The slots 702 are positioned in the housing so that when the card edge connector is slid into place contact is made between the card edge contacts 701 and card edge contacts on the top side of a circuit card. The installation of a circuit card is aided by the alignment element 703. A circuit card may be manufactured with a notch located on the edge of a card edge connector which is positioned to align with the alignment element 703. Aligning the notch with the alignment element 703 aids in the installation of a circuit card by ensuring that the card edge contacts 701 make contact with the corresponding card edge contacts on the circuit card.

Figure 8:
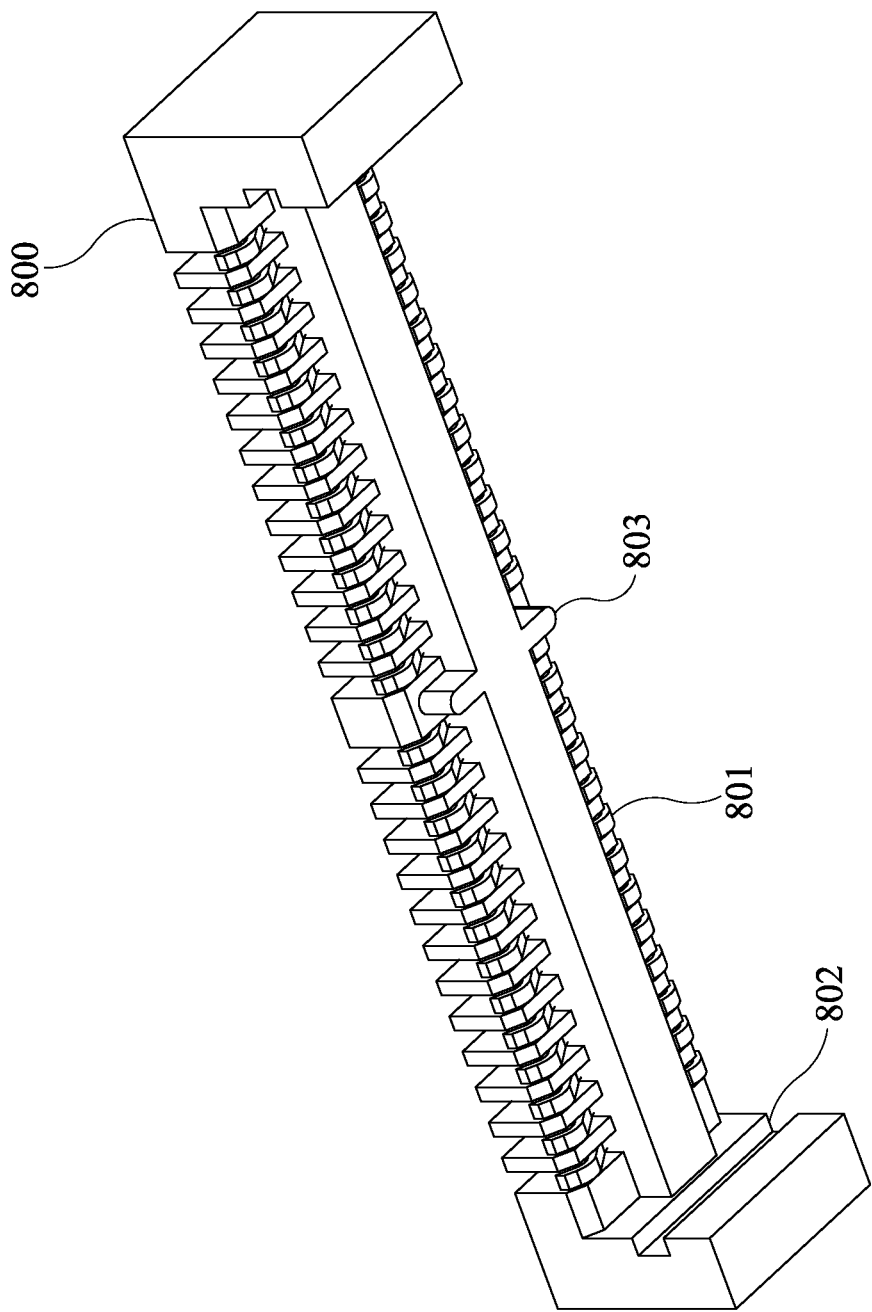
FIG. 8 depicts a bottom view of a card edge connector.

FIG. 8 depicts a bottom view of a card edge connector. FIG. 8 depicts a card edge connector that includes a housing 800, card edge contacts 801, slots 802, and alignment elements 803. The alignment elements 803 are located on each side of the housing 800 for each of the two rows of card edge contacts 801. The slots 802 span the width of the housing 800 which allows the card edge connector to slide along a rib element located on an LGA socket housing. Some embodiments may use alignment elements other than slots and ribs or no alignment elements at all. For example, the card edge connector may be aligned by hand and attached to an LGA socket housing using an adhesive.

Figure 9:
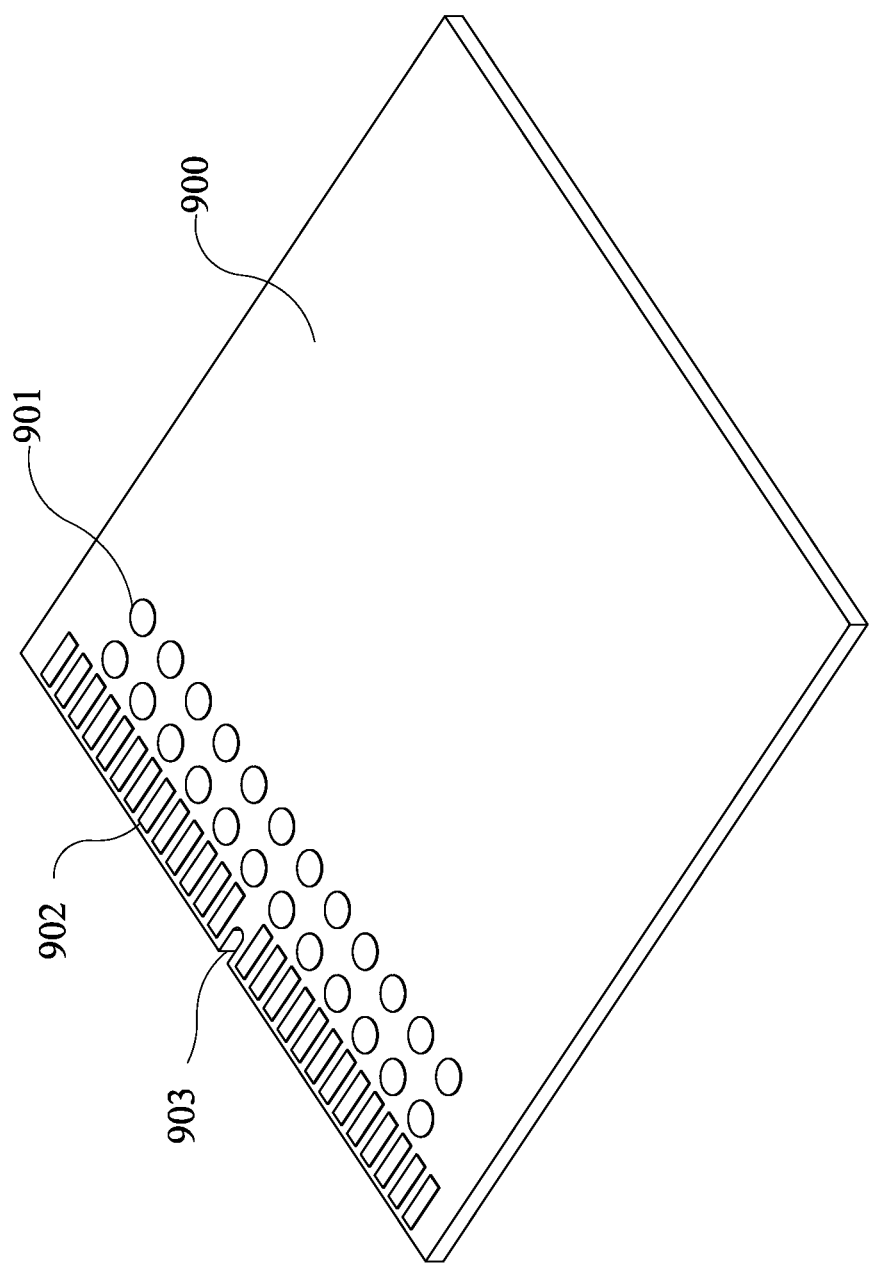
FIG. 9 depicts an underside of a circuit card with card edge contacts, conductive pads, and an alignment notch.

FIG. 9 depicts an underside of a circuit card with card edge contacts, conductive pads, and an alignment notch. FIG. 9 depicts an underside of a circuit card 900 that includes card edge contacts 902, conductive pads 901, and alignment notch 903. The circuit card 900 is designed to work with an LGA socket and card edge connector such as those depicted in FIG. 1. The card edge contacts 902 make contact with card edge contacts located on an LGA socket and card edge connector. During installation the alignment notch 903 may align with a corresponding alignment element in a card edge connector to ensure the card edge contacts 902 make contact with the appropriate card edge contacts located in an LGA socket and card edge connector. The conductive pads 901 allow more connections for the circuit card 900 than those allowed by the card edge contacts 902, since once the circuit card 900 is installed in an LGA socket, the conductive pads 901 may make contact with LGA socket contacts. The conductive pads 901 may serve to receive power for the circuit card 900 or serve as additional I/O connections through contact with LGA socket contacts mounted on a PCB. The conductive pads 901 are depicted as circular but may take any size or shape capable of connecting to LGA socket contacts.

An LGA socket and card edge connector such as those described above allow for the installation of two circuit cards aligned end to end or in the same horizontal plane. However, installing one of the circuit cards in a vertical plane may allow for more physical space or circuit card accessibility. The LGA socket and card edge connector described in FIGS. 10-15 below allow for the installation of a first circuit card in a horizontal plane and a second circuit card in a vertical plane at a right angle to the first circuit card. Installing the circuit cards in this manner may save space within a computer system and allow for easier access to the first or second circuit card.

Figure 10:
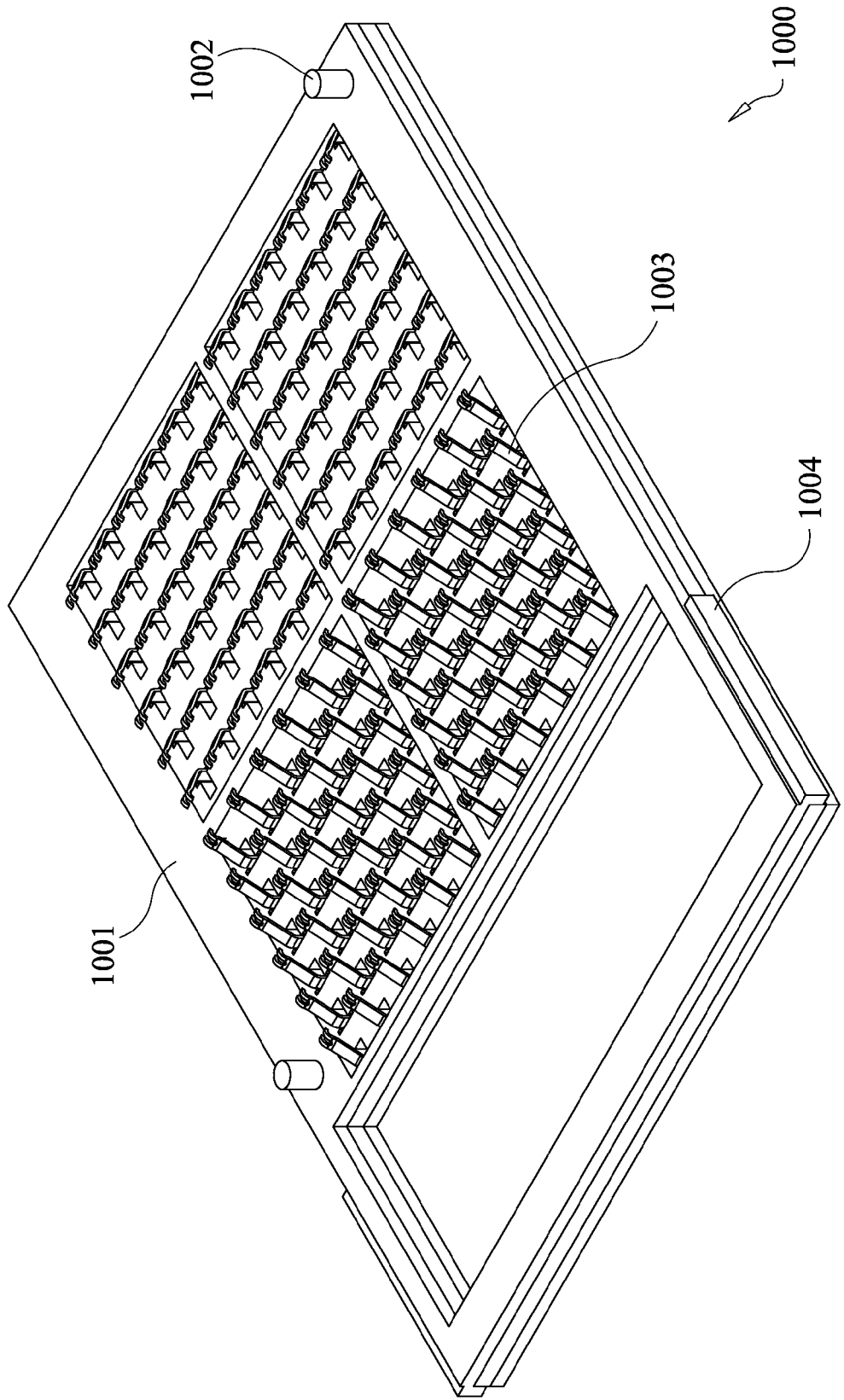
FIG. 10 depicts a LGA socket with an extended portion for a right angle card edge connector.

FIG. 10 depicts a LGA socket with an extended portion for a right angle card edge connector. FIG. 10 depicts an LGA socket 1000 that includes a socket housing 1001, an alignment pin 1002, socket contacts 1003, and rib elements 1004. The LGA socket 1000 is comparable to the LGA socket 100 described in FIG. 1; however, LGA socket 1000 lacks integrated card edge contacts and a second footprint of socket contacts for connection to a second circuit card. Instead, the LGA socket 1000 includes only the footprint of socket contacts 1003 for a first circuit card and does not include any card edge contacts. The LGA socket 1000 does include the rib elements 1004 located on opposite sides of the socket housing 1001. The rib elements 1004 allow for the installation of a card edge connector that includes card edge contacts. As described below, the installation of a card edge connector allows for a circuit card with an extended portion of card edge contacts seated in the LGA socket 1000 to make a connection with a second circuit card.

Figure 11:
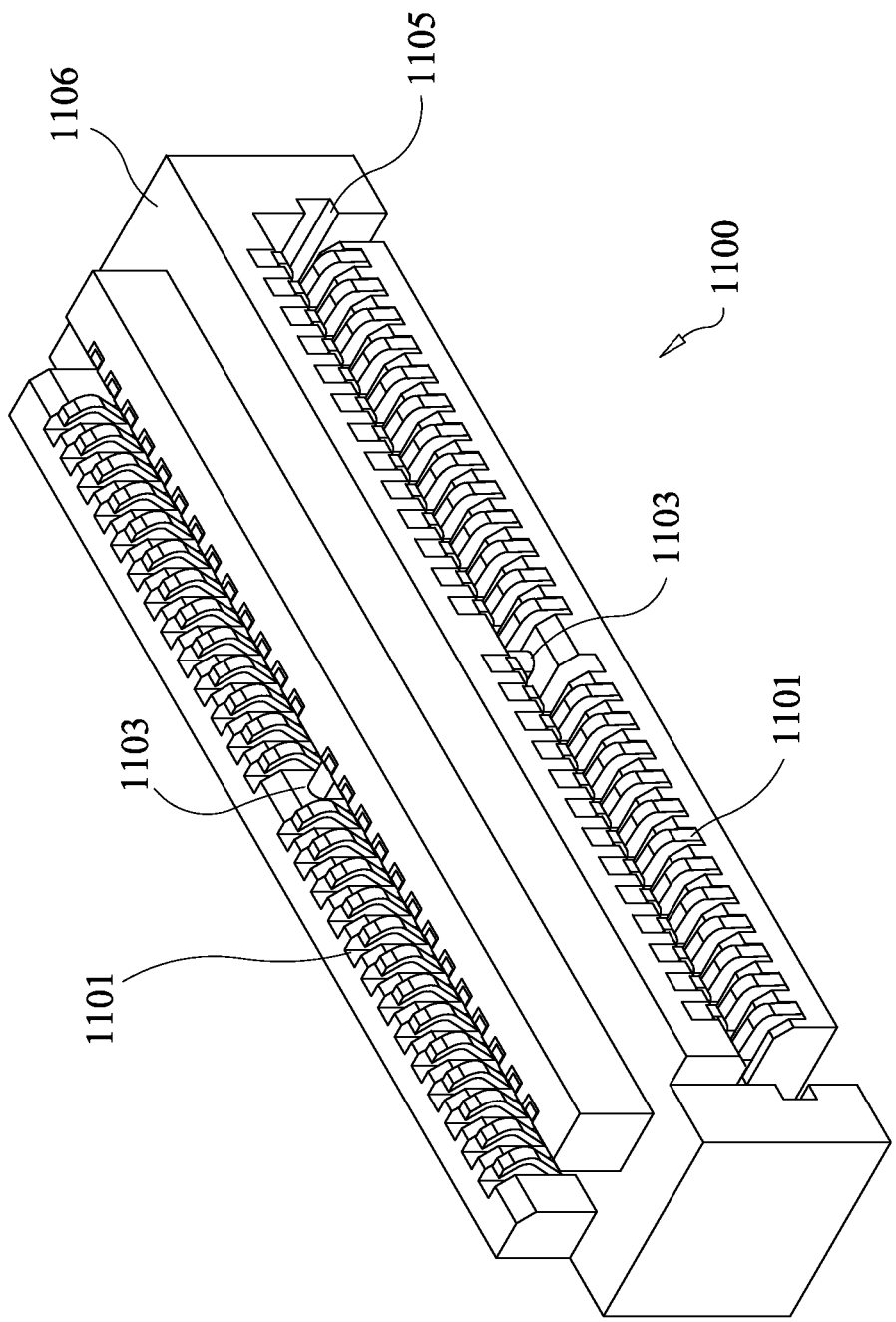
FIG. 11 depicts a right angle card edge connector.

FIG. 11 depicts a right angle card edge connector. FIG. 11 depicts a right angle card edge connector 1100 that includes card edge contacts 1101, alignment elements 1103, slots 1105, and a housing 1106. The alignment elements 1103 and slots 1105 operate similarly to the alignment and rib elements described in the description of the card edge connector depicted in FIGS. 7 and 8. The alignment elements 1103 aid in installing circuit cards and aligning the card edge contacts 1101 with the appropriate card edge contacts on installed circuit cards. The slots 1105 also aid in the installation of circuit cards and allow the right angle card edge connector to slide into place on rib elements of an LGA socket. The housing 1106 forms a right angle to allow a circuit card to be installed in the vertical direction. The installation procedure will be described in further detail in the figures below.

The right angle card edge connector positions the card edge contacts 1101 so that two circuit cards may be installed at a ninety degree angle in relation to each other. However, some embodiments may position the card edge contacts 1101 at different angles to fit a specific application. For example, some applications may require the card edge contacts 1101 to be positioned so that two circuit cards may be installed at a forty-five degree angle in relation to each other.

FIGS. 12-15 depict the installation of a processor module and a circuit card into the LGA socket 1000 using the card edge connector 1100, as described in FIGS. 10 and 11. The installation depicted in FIGS. 12-15 is just one example of a way in which a processor module and circuit card could be installed. Additionally, the processor module and the circuit card are used for illustrative purposes only and should not be used to limit the scope of the claims, as the LGA socket 1000 may be configured to accept the installation of a variety of circuit cards.

Figure 12:
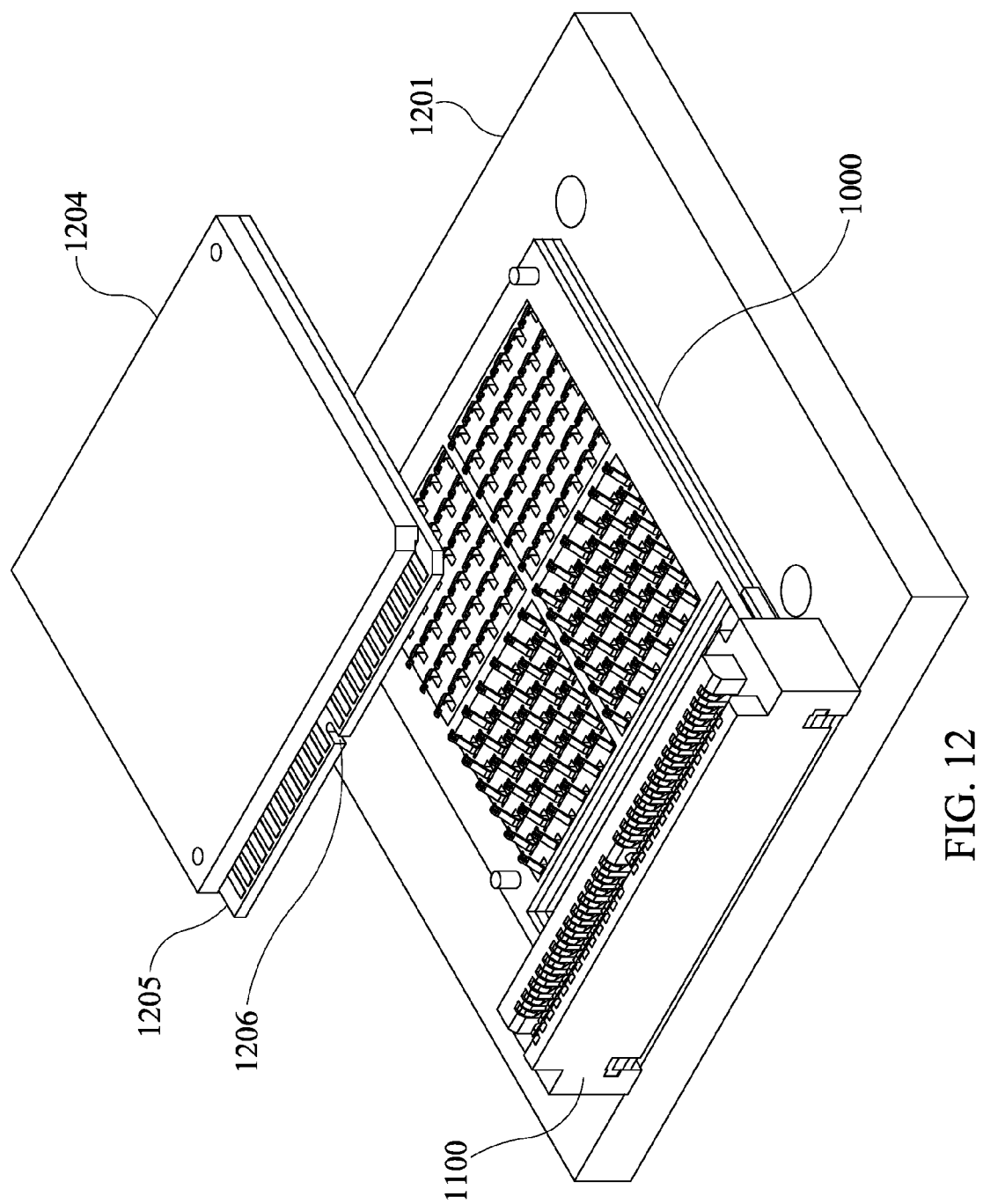
FIG. 12 depicts a processor module before installation into an LGA socket using a right angle card edge connector.

FIG. 12 depicts a processor module before installation into an LGA socket using a right angle card edge connector. FIG. 12 depicts the LGA socket 1000, the card edge connector 1100, and a processor module 1204. The LGA socket 1000 is installed on PCB 1201 using any known mounting method, such as a BGA. The processor module 1204 includes an extended edge 1205 that includes card edge contacts and an alignment notch 1206. The card edge connector 1100 is disengaged from the LGA socket 1000 to allow space for the processor module 1204 to be seated in the Z-axis direction.

Figure 13:
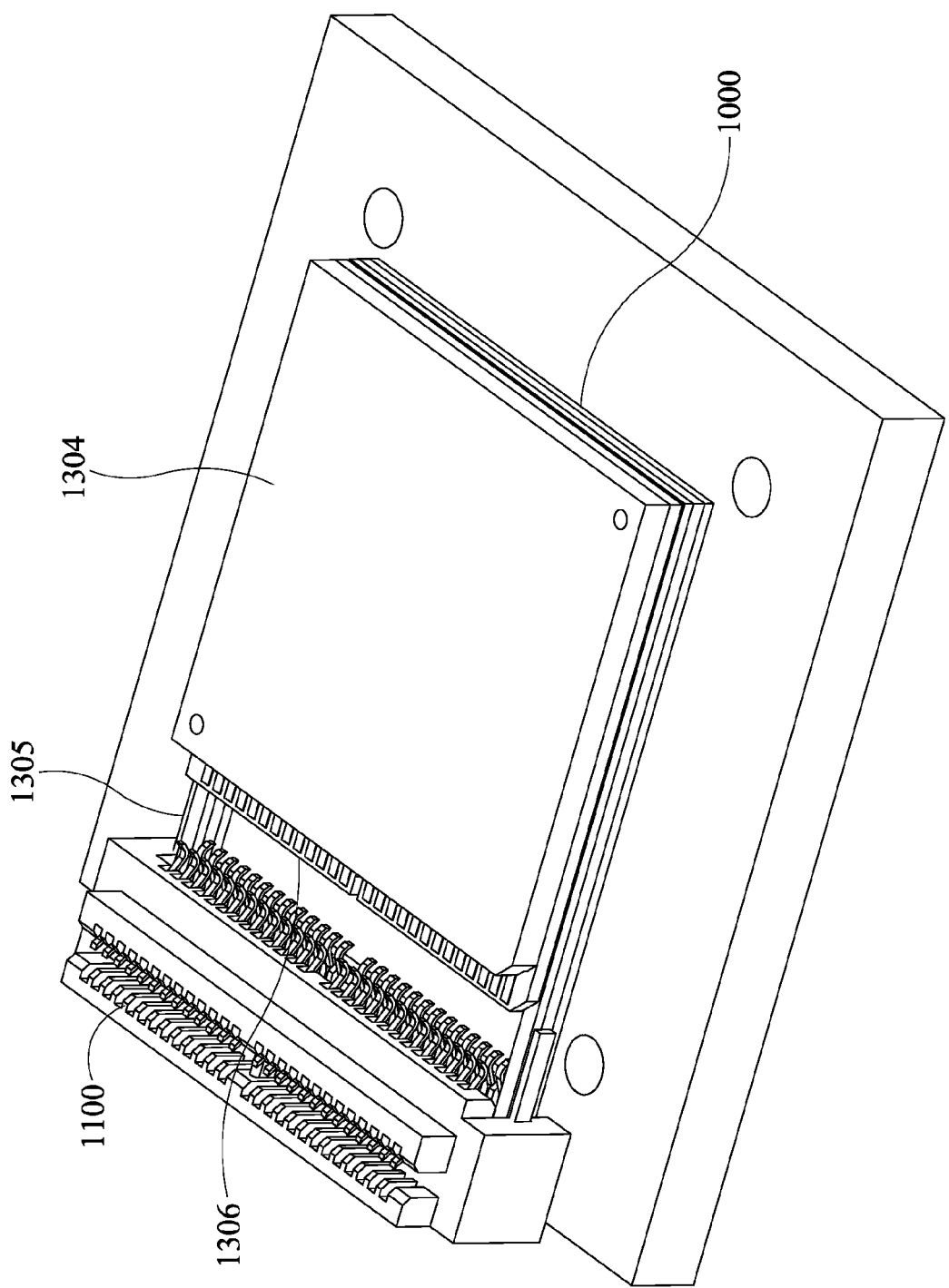
FIG. 13 depicts a processor module seated in an LGA socket before placement of a right angle card edge connector over an extended edge of the processor module.

FIG. 13 depicts a processor module seated in an LGA socket before placement of a right angle card edge connector over an extended edge of the processor module. FIG. 13 depicts the LGA socket 1000 that includes rib elements 1305. FIG. 13 also depicts a processor module 1304 that is seated into the LGA socket 1000. The processor module 1304 may be seated a cavity of the LGA socket 100 using Z-axis or vertical loading and may be aligned by alignment pins located on the LGA socket 1000. FIG. 13 also depicts the card edge connector 1100, which is currently disengaged from the processor module 1304. The card edge connector 1100 has been aligned with the rib elements 1305 and is ready to be moved into contact with the extended edge 1306 of processor module 1304.

Figure 14:
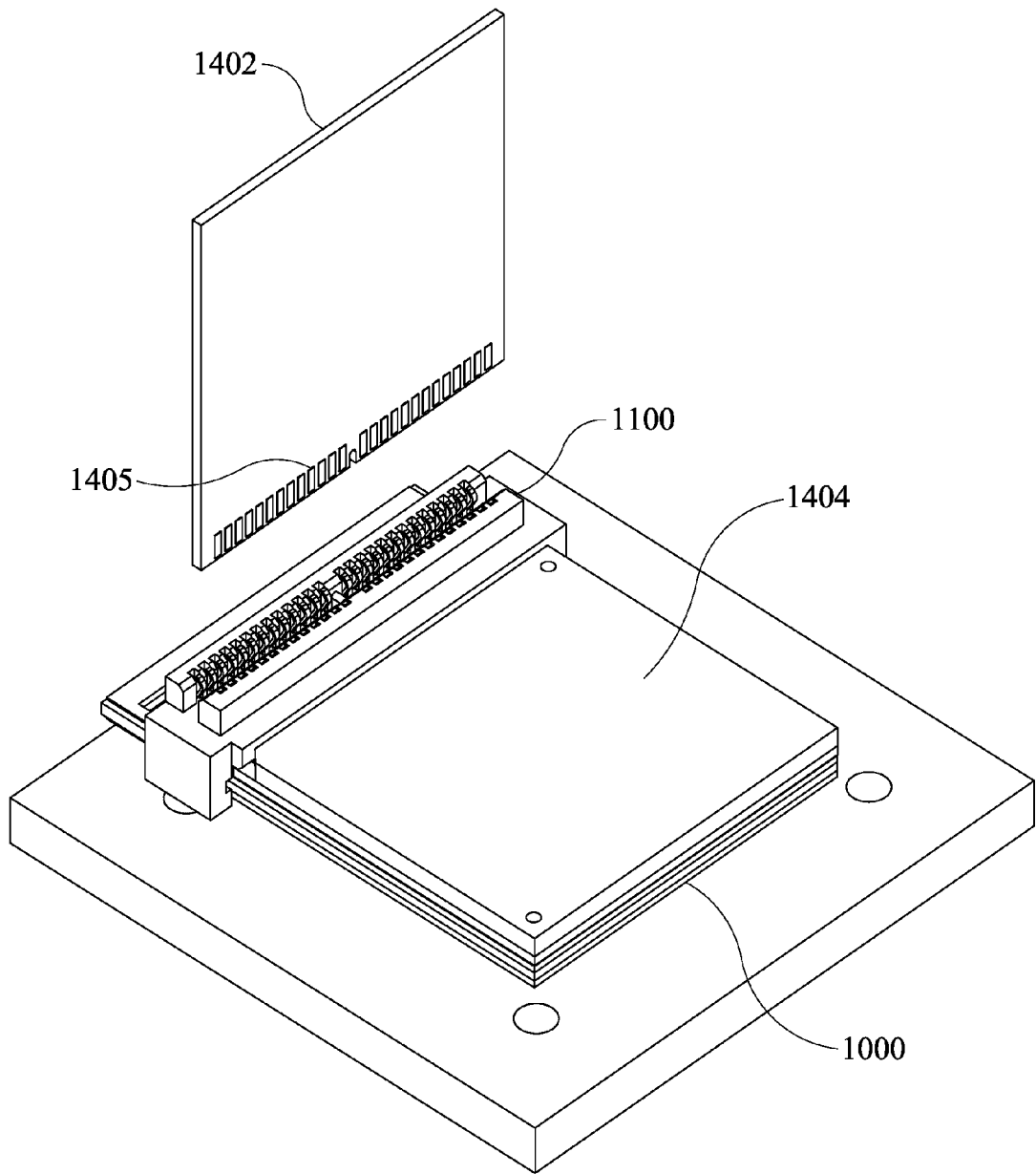
FIG. 14 depicts a seated processor module that has been mated with a right angle card edge connector and a circuit card before installation.

FIG. 14 depicts a seated processor module that has been mated with a right angle card edge connector and a circuit card before installation. FIG. 14 depicts a processor module 1404 that has been seated into the LGA socket 1000 and mated with the card edge connector 1100. The card edge connector 1100 has been integrated with the LGA socket 1000 by sliding into place over the rib elements of the LGA socket 1000 and mating with the extended edge of the processor module 1404. FIG. 14 also depicts an uninstalled circuit card 1402 with card edge contacts 1405. The card edge connector 1100 has been moved into place so that the card edge contacts of the card edge connector 1100 are in contact with the card edge contacts on the extended edge of processor module 1404. The circuit card 1402 is situated at a right angle to the processor module 1404 in preparation for installation.

Figure 15:
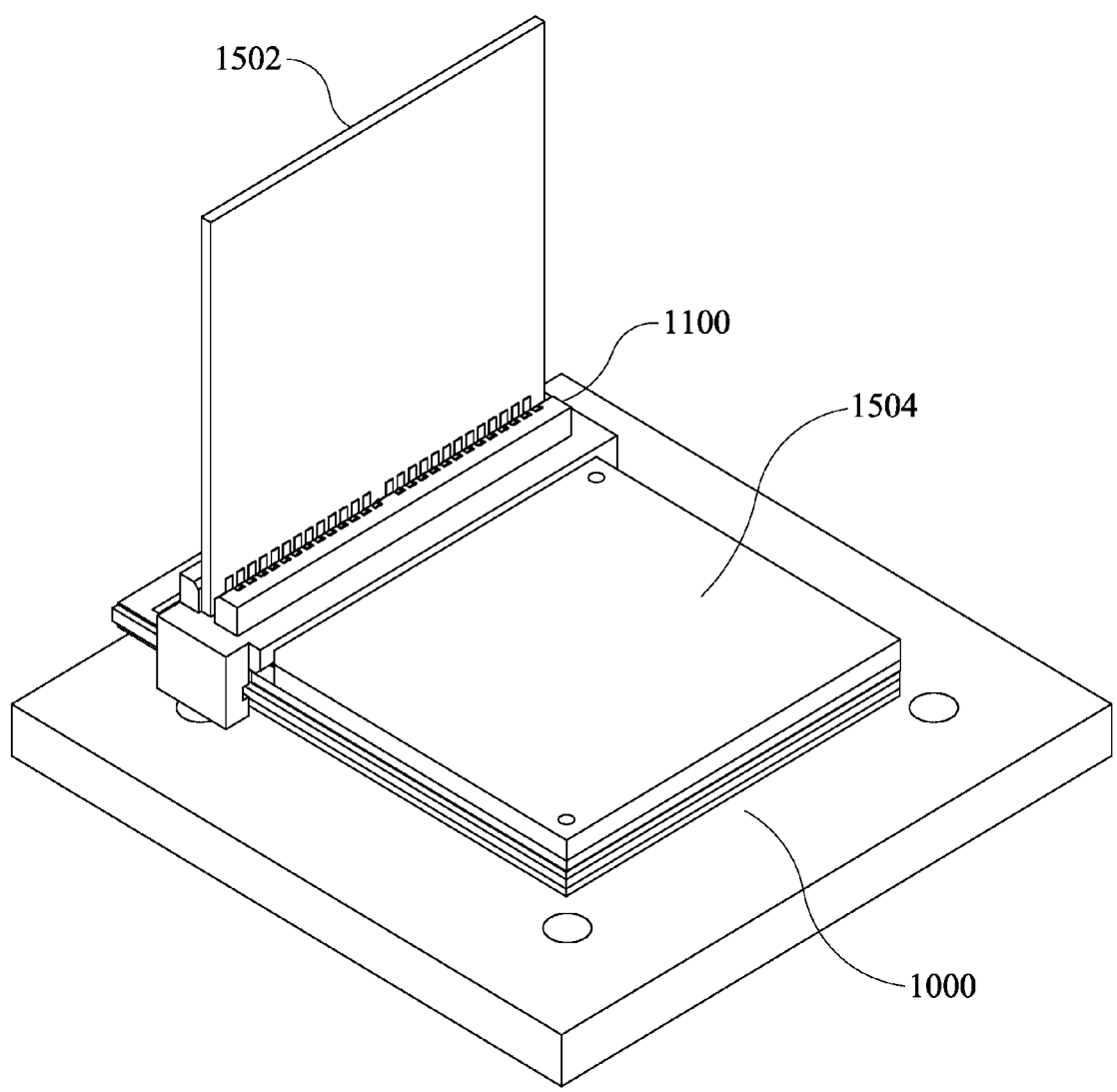
FIG. 15 depicts an installed processor module and circuit card installed on an LGA socket with an integrated right angle card edge connector.

FIG. 15 depicts an installed processor module and circuit card installed on an LGA socket with an integrated right angle card edge connector. FIG. 15 depicts a processor module 1504 that has been seated into the LGA socket 1000 and mated with the card edge connector 1100. Also depicted is circuit card 1502 that has been mated with the card edge connector 1100. The circuit card 1502 is inserted into the card edge connector 1100 by applying pressure in the Z-axis direction. Once mated the processor module 1504 and the circuit card 1502 can communicate through the card edge contacts in the card edge connector 1100.

As mentioned earlier, an electromechanical assembly for connecting circuit cards can associate a card edge connector with a socket in different manners. In some embodiments, a card edge connector can be affixed or attached to the socket housing. In some embodiments, the card edge connector is not affixed or attached to the socket housing, but can have different positions with respect to the socket with at least one of those positions creating an electrical connection between a circuit card inserted into the card edge connector and another circuit card seated in the socket.

While the embodiments are described with reference to various implementations and exploitations, it will be understood that these embodiments are illustrative and that the scope of the inventive subject matter is not limited to them. In general, techniques for connecting circuit cards through a card edge connector on an LGA socket as described herein may be implemented with facilities consistent with any hardware system or hardware systems. Many variations, modifications, additions, and improvements are possible.

Plural instances may be provided for components, operations or structures described herein as a single instance. Finally, particular operations are illustrated in the context of specific illustrative configurations. Other allocations of functionality are envisioned and may fall within the scope of the inventive subject matter. In general, structures and functionality presented as separate components in the exemplary configurations may be implemented as a combined structure or component. Similarly, structures and functionality presented as a single component may be implemented as separate components. These and other variations, modifications, additions, and improvements may fall within the scope of the inventive subject matter.

What is claimed is:

1. An electromechanical assembly comprising:
   a socket housing having,
      a cavity for seating an integrated circuit;
      a first plurality of electrical contacts in the cavity to electrically connect an integrated circuit with a circuit board;
      a supporting body on a different plane than a bottom surface of the cavity;
      a second plurality of electrical contacts that form a first row across the supporting body;
      a third plurality of electrical contacts that form a second row across the supporting body;
      alignment elements; and
   a card edge connector having,
      slots adapted to accept the alignment elements of the socket housing;
      a fourth plurality of electrical contacts that form a third row; and
      a fifth plurality of electrical contacts that form a fourth row.

2. The electromechanical assembly of claim 1 further comprising a land grid array socket that includes the socket housing.

3. The electromechanical assembly of claim 1, wherein:
   the alignment elements of the socket housing comprise ribs on opposite outer portions of the socket housing; and
   the slots are within edge portions of the card edge connector.

4. The electromechanical assembly of claim 1 further comprising another alignment element adapted to align a circuit card into the cavity.

5. The electromechanical assembly of claim 1, wherein the alignment elements are adapted to align the card edge connector to a position with the fourth plurality of electrical contacts facing the second plurality of electrical contacts and the fifth plurality of contacts facing the third plurality of electrical contacts.

6. The electromechanical assembly of claim 1, wherein the first plurality of electrical contacts comprise socket contacts, wherein the second, third, fourth, and fifth pluralities of electrical contacts comprise card edge contacts.

7. The electromechanical assembly of claim 1, wherein the first row and the second row are parallel to each other on a first plane, wherein the third row and the fourth row are parallel to each other on a second plane.

8. The electromechanical assembly of claim 1, wherein the card edge connector is mechanically attached to the socket housing.

9. An electromechanical assembly comprising:
   a socket adapted for seating an integrated circuit, the socket having,
      a first plurality of electrical contacts for an integrated circuit seated in the socket,
      a second plurality of electrical contacts for an integrated circuit seated in the socket;
      a third plurality of electrical contacts for a circuit card;
      first card edge connector alignment elements; and
   a card edge connector having,
      a fourth plurality of electrical contacts adapted for an integrated circuit seated in the socket,
      a fifth plurality of electrical contacts adapted for a circuit card inserted into the card edge connector, and
      second card edge connector alignment elements.

10. The electromechanical assembly of claim 9, wherein the card edge connector comprises a first body that supports the fourth plurality of electrical contacts and a second body that supports the fifth plurality of electrical contacts, wherein the first body and the second body form an angle that is between 0 degrees and 180 degrees.

11. The electromechanical assembly of claim 9, wherein the socket comprises at least one of a land grid array socket, a zero insertion force socket, and a pin grid array socket.

12. The electromechanical assembly of claim 9, wherein the socket comprises a socket housing and the first card edge connector alignment elements comprise ribs on opposite sides of the socket housing.

13. The electromechanical assembly of claim 12, wherein the second card edge connector alignment elements comprise slots in opposite end portions of the card edge connector.

14. The electromechanical assembly of claim 9, wherein the card edge connector is coupled with the socket.

15. A method comprising:
   seating an integrated circuit within a socket of an electromechanical assembly, the socket having:
      a first plurality of electrical contacts for the integrated circuit seated in the socket;
      a second plurality of electrical contacts for the integrated circuit seated in the socket;
      a third plurality of electrical contacts for a circuit card;
      first edge connector alignment elements; and
   inserting the circuit card into a card edge connector of the electromechanical assembly, the card edge connector having:
      a fourth plurality of electrical contacts adapted for the integrated circuit seated in the socket;
      a fifth plurality of electrical contacts adapted for the circuit card inserted into the card edge connector; and
      second edge connector elements.

16. The method of claim 15, further comprising coupling the card edge connector with the socket.

17. The method of claim 15, wherein the card edge connector further has a first body that supports the fourth plurality of electrical contacts and a second body that supports the fifth plurality of electrical contacts, wherein the first body and the second body form an angle that is between 0 degrees and 180 degrees.

18. The method of claim 15, wherein the socket further has at least one of a land grid array socket, a zero insertion force socket, and a pin grid array socket.

19. The method of claim 15, wherein the socket further has a socket housing and the first card edge connector alignment elements comprise ribs on opposite sides of the socket housing.

* * * * *